United States Patent
Light et al.

(10) Patent No.: US 8,969,214 B2
(45) Date of Patent: Mar. 3, 2015

(54) METHODS OF FORMING A PATTERN ON A SUBSTRATE

(71) Applicant: Micron Technology, Inc., Boise, ID (US)

(72) Inventors: Scott L. Light, Boise, ID (US); Kyle Armstrong, Meridian, ID (US); Michael D. Hyatt, Boise, ID (US); Vishal Sipani, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/893,546

(22) Filed: May 14, 2013

(65) Prior Publication Data

US 2014/0342563 A1 Nov. 20, 2014

(51) Int. Cl.
*H01L 21/302* (2006.01)
*H01L 21/308* (2006.01)

(52) U.S. Cl.
CPC ................... *H01L 21/3086* (2013.01)
USPC .............. 438/736; 438/639; 438/717; 216/46

(58) Field of Classification Search
CPC ............... H01L 21/31127; H01L 21/31138; H01L 21/76811; H01L 21/76852; H01L 21/76831
USPC ......... 438/637, 639, 700, 714, 717, 725, 734, 438/737, 736, 738; 430/299, 312, 313; 216/41, 46
See application file for complete search history.

(56) References Cited

U.S. PATENT DOCUMENTS

| | | | | |
|---|---|---|---|---|
| 8,623,772 | B2 * | 1/2014 | Eom | 438/736 |
| 2003/0230234 | A1 * | 12/2003 | Nam et al. | 117/97 |
| 2007/0210449 | A1 * | 9/2007 | Caspary et al. | 257/734 |

OTHER PUBLICATIONS

Zimmerman, Paul; Double Patterning Lithography: Double the Trouble or Double the Fun?; SPIE Newsroom; 10.1172/2.1200906.1691; Jul. 20, 2009; 3 pp.

* cited by examiner

*Primary Examiner* — Lan Vinh
(74) *Attorney, Agent, or Firm* — Wells St. John, P.S.

(57) ABSTRACT

A method of forming a pattern on a substrate includes forming spaced first features derived from a first lithographic patterning step. Sidewall spacers are formed on opposing sides of the first features. After forming the sidewall spacers, spaced second features derived from a second lithographic patterning step are formed. At least some of individual of the second features are laterally between and laterally spaced from immediately adjacent of the first features in at least one straight-line vertical cross-section that passes through the first and second features. After the second lithographic patterning step, all of only some of the sidewall spacers in said at least one cross-section is removed.

21 Claims, 8 Drawing Sheets

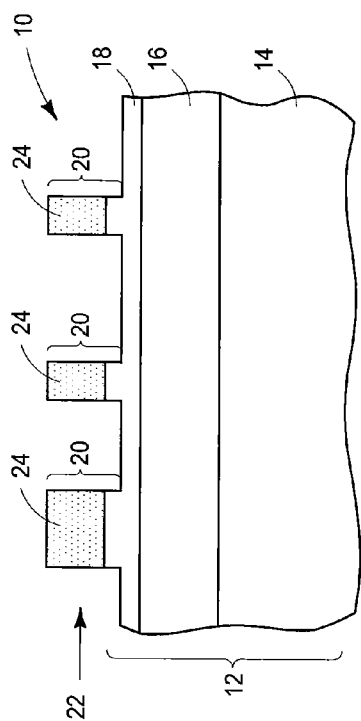
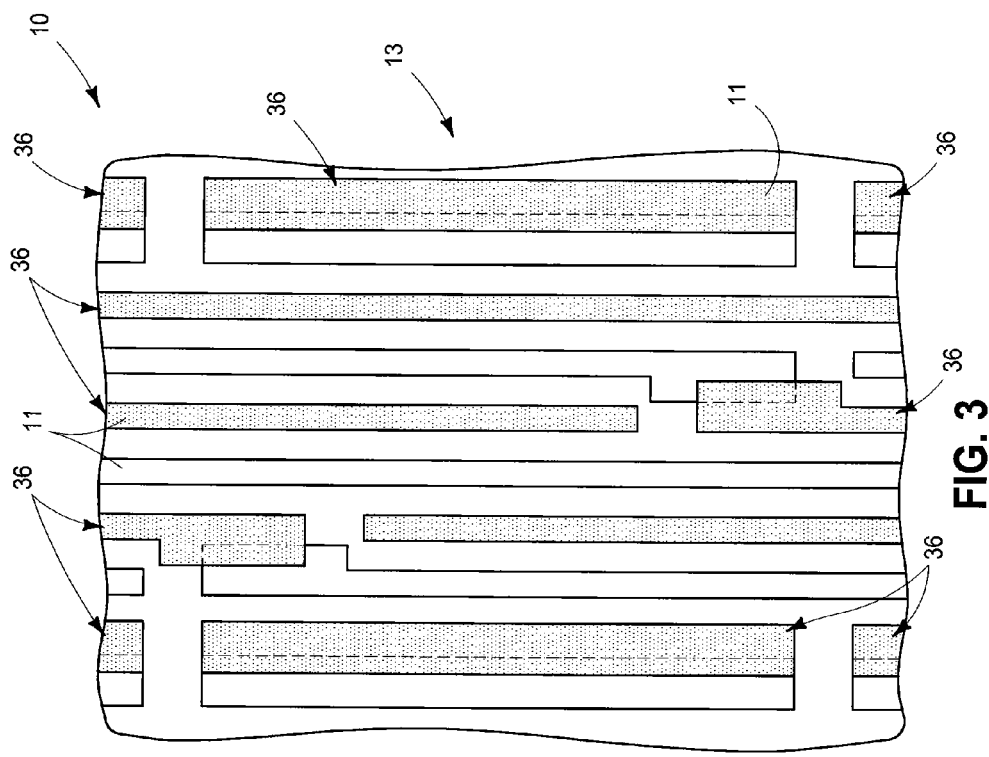

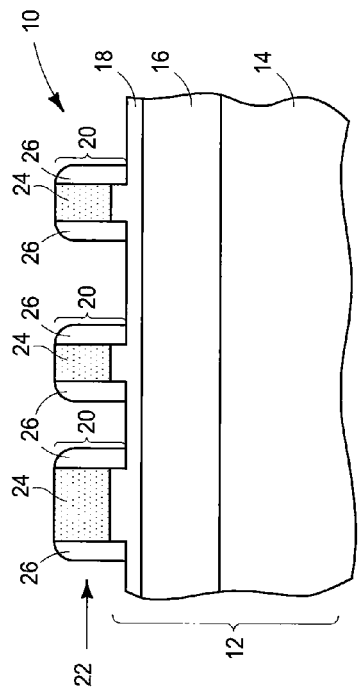
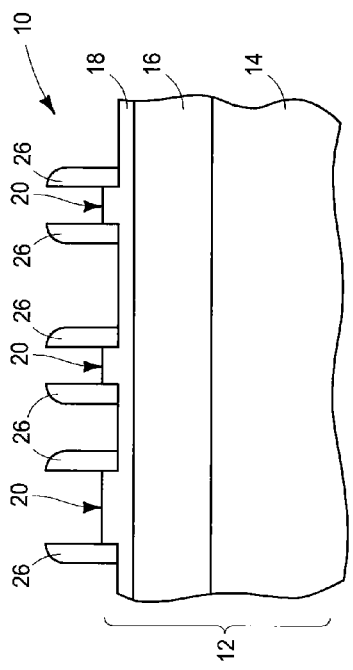
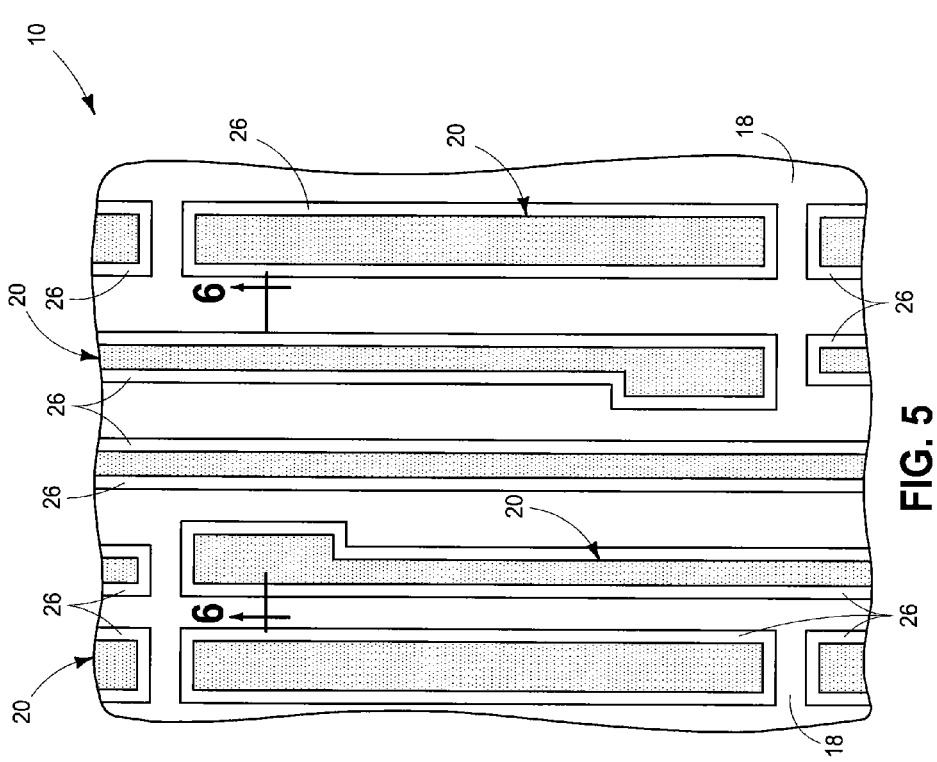

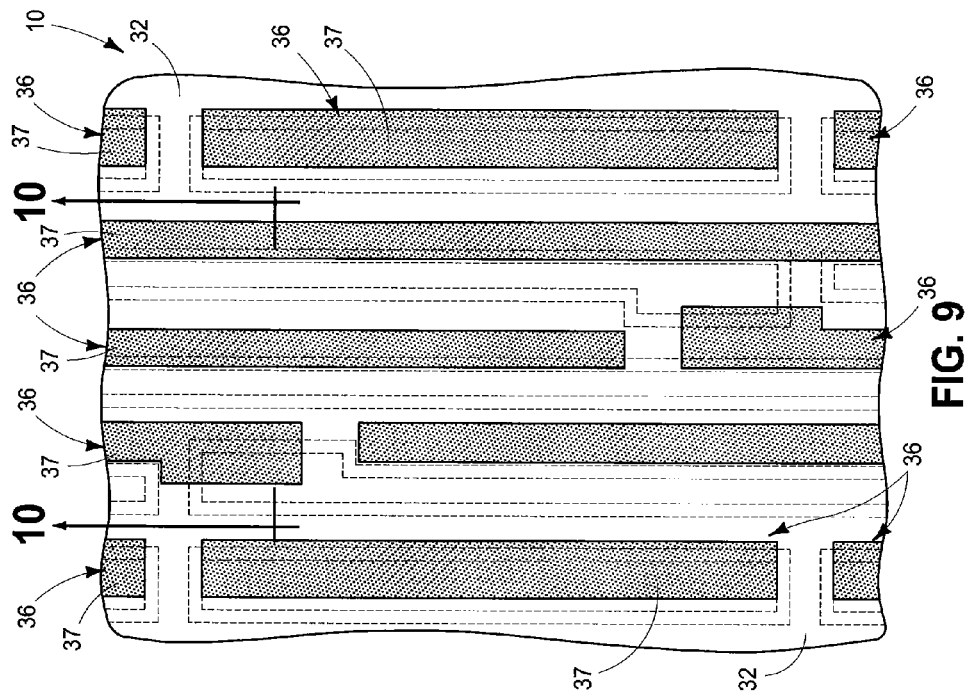
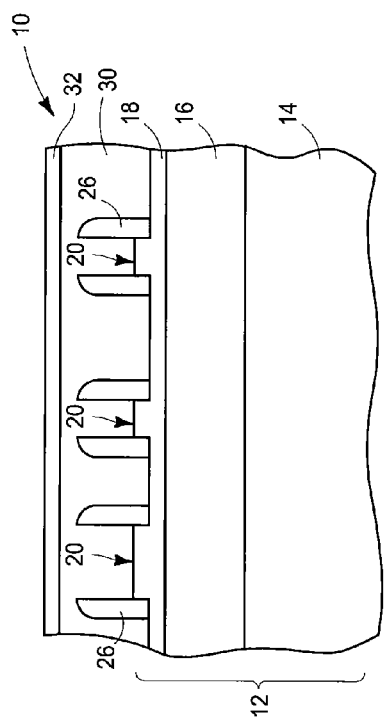
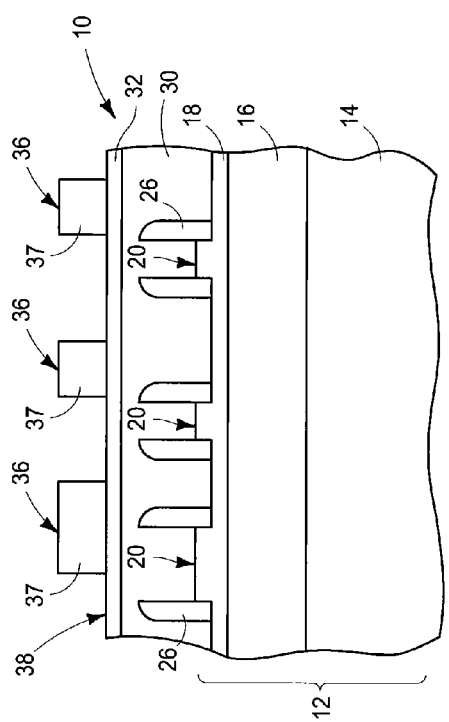

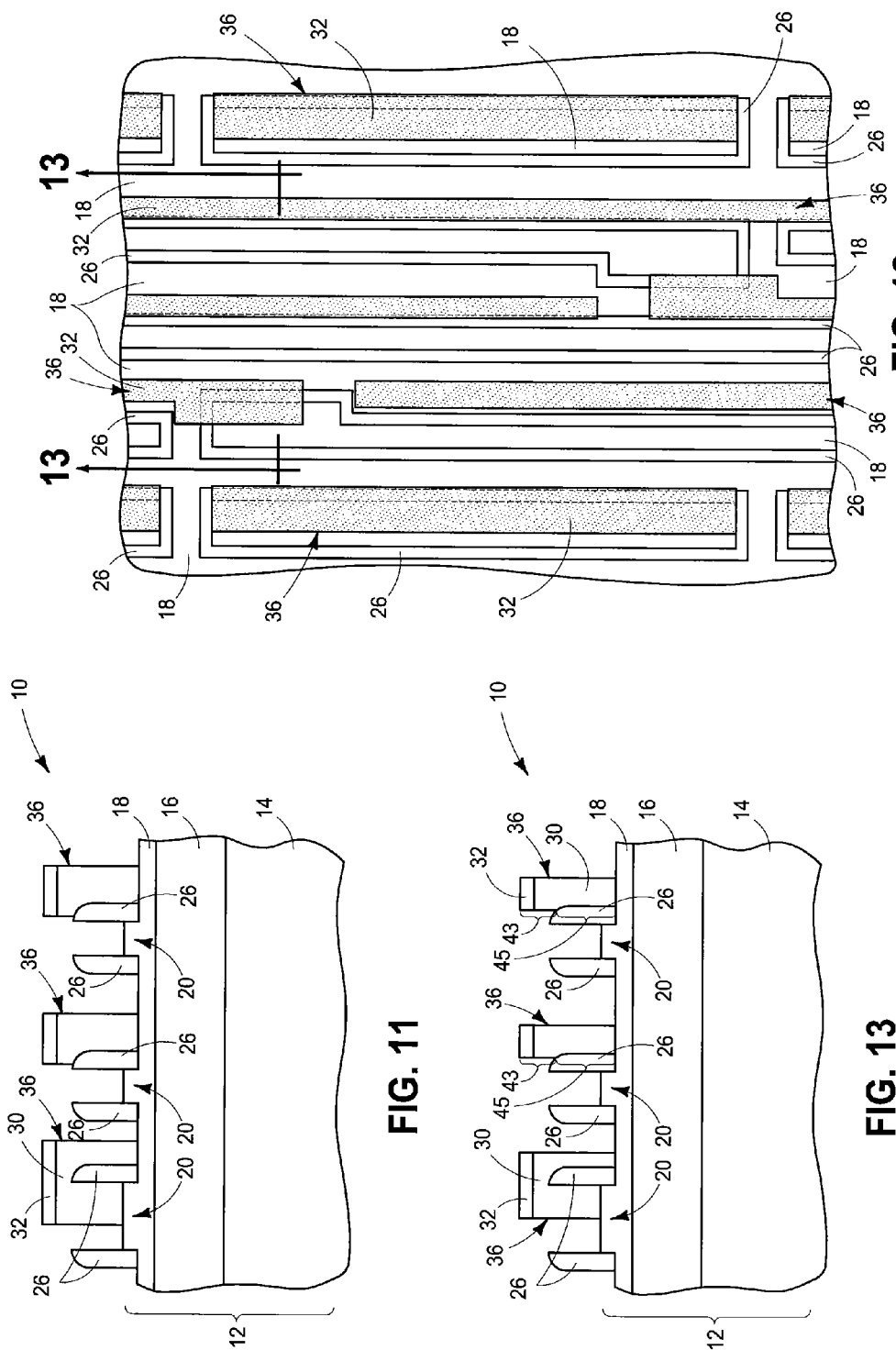

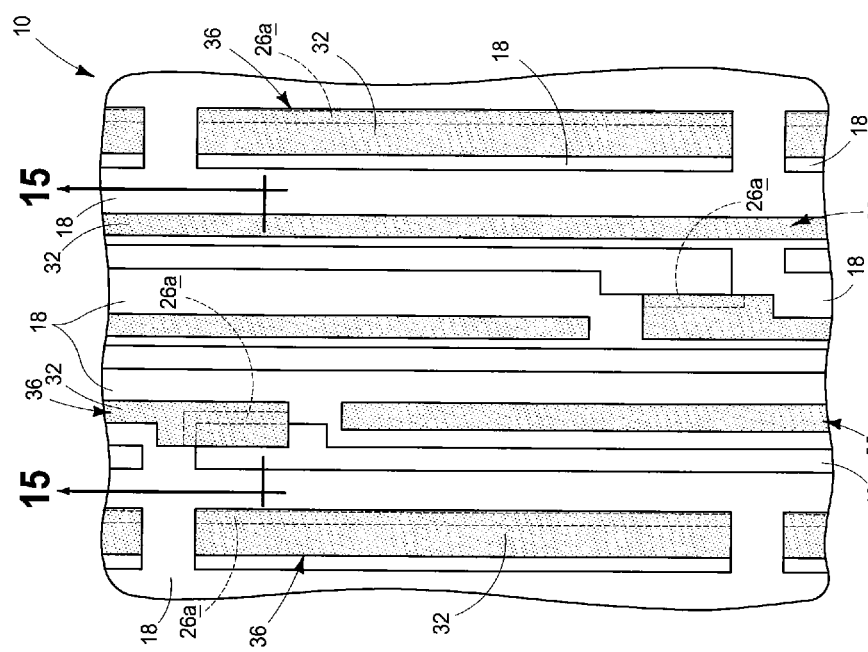
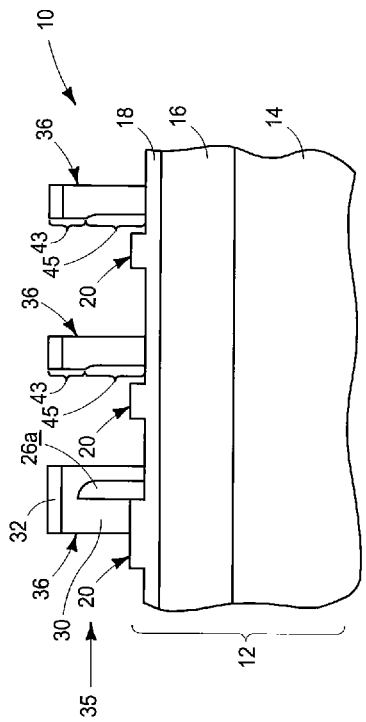
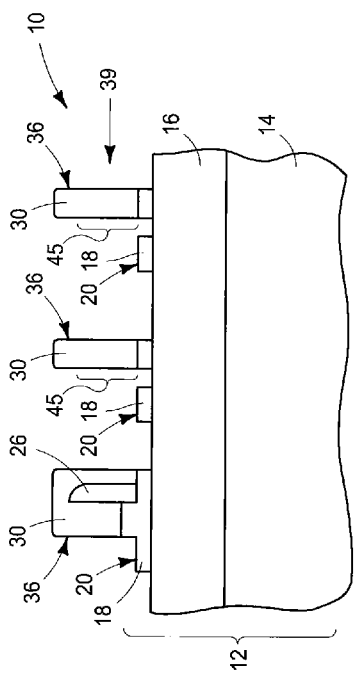
FIG. 14
FIG. 15
FIG. 16

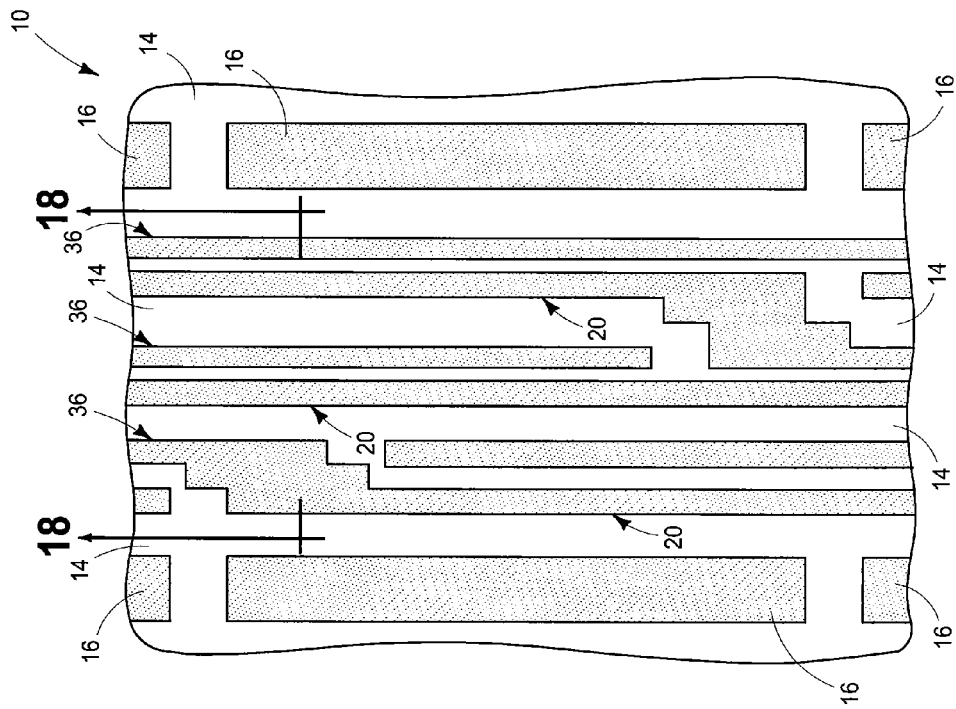
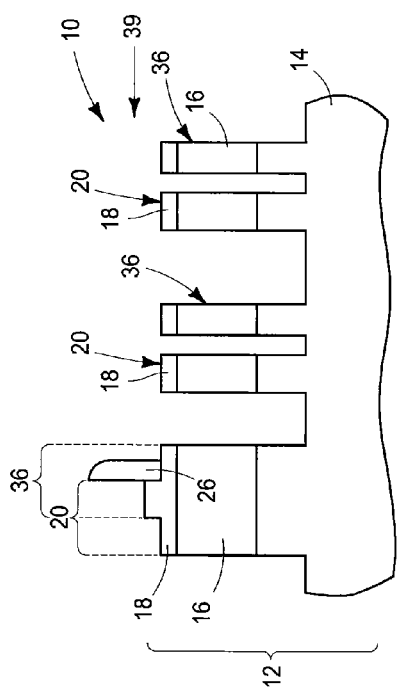
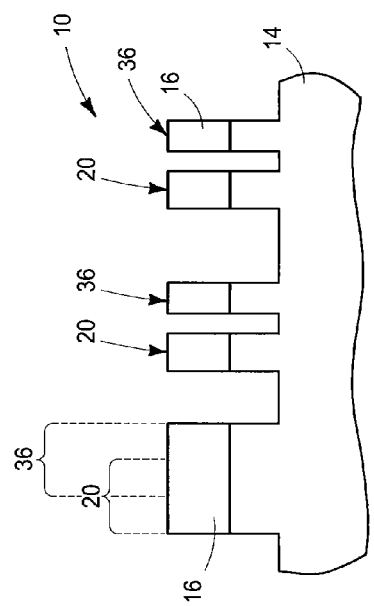

METHODS OF FORMING A PATTERN ON A SUBSTRATE

TECHNICAL FIELD

Embodiments disclosed herein pertain to methods of forming a pattern on a substrate.

BACKGROUND

Integrated circuits are commonly formed on a semiconductor substrate such as a silicon wafer or other semiconductive material. In general, layers of various materials which are semiconductive, conductive, or electrically insulative are used to form the integrated circuits. By way of examples, the various materials may be doped, ion implanted, deposited, etched, grown, etc. using various process. A continuing goal in semiconductive processing is to reduce the size of individual electronic components, thereby enabling smaller and denser integrated circuitry.

One technique for patterning and processing semiconductor substrates is lithography. Such may include deposition of a patternable masking layer over underlying substrate material. The masking layer may be patterned to form openings there-through of desired shapes and configuration. The underlying substrate material may be processed through the openings in the masking material (e.g., by ion implanting, etching, etc.) to produce a desired change in the underlying substrate material having or approximating the pattern in the masking material. The masking layer which may be used may be referred to as resist, with photoresist used in photolithography being one example. In certain instances, multiple different layers of photoresist and/or a combination of photoresist with hard-masking and other materials are used. Further, patterns may be formed on substrates without using resist or photoresist.

The continual reduction in feature sizes of integrated circuit components places ever greater demands on the techniques used to form those features. For example, photolithography is commonly used to form pattern features such as conductive lines and arrays of contact openings to underlying circuitry. A concept commonly referred to as "pitch" can be used to describe the sizes of the repeating features in conjunction with spaces immediately adjacent thereto. Pitch may be defined as the distance between an identical point in two neighboring features of a repeating pattern in a straight-line cross-section, thereby including the maximum width of the feature and the space to the next immediately adjacent feature. However, due to factors such as optics and light or radiation wavelength, photolithography techniques tend to have a minimum pitch below which a particular technique cannot reliably form features. Thus, minimum pitch of a photolithographic technique is an obstacle to continued feature size reduction using photolithography.

Techniques that have been used to overcome these limitations include pitch multiplication. Such typically forms features narrower than minimum photolithography resolution by depositing one or more spacer-forming layers to have a total lateral thickness which is less than that of the minimum capable photolithographic feature size. The spacer-forming layers are commonly anisotropically etched to form sub-lithographic features, and then the features which were formed at the minimum photolithographic are etched from the substrate.

An additional technique employs using two lithographic patterning steps to ultimately form a single pattern in an underlying hard-masking layer. However, this requires precisely positioning the second lithographic masking step relative to the first masking step. If alignment isn't exactly correct, subject to acceptable alignment tolerance, the ultimate pattern can fail resulting in inoperable or destructed circuitry.

BRIEF DESCRIPTION OF THE DRAWINGS

FIG. 3 is a diagrammatic top plan view of another mask pattern overlain onto the FIG. 2 mask pattern.

FIG. 4 is an enlarged sectional view taken through line 4-4 in FIG. 2.

FIG. 5 is a diagrammatic top plan view of the FIG. 2 substrate at a processing step subsequent to that shown by FIG. 2.

FIG. 6 is an enlarged sectional view taken through line 6-6 in FIG. 5.

FIG. 7 is a view of the FIG. 6 substrate at a processing step subsequent to that shown by FIG. 6.

FIG. 8 is a view of the FIG. 7 substrate at a processing step subsequent to that shown by FIG. 7.

FIG. 9 is a diagrammatic top plan view of the FIG. 8 substrate, original scale, at a processing step subsequent to that shown by FIG. 8.

FIG. 10 is an enlarged sectional view taken through line 10-10 in FIG. 9.

FIG. 11 view of the FIG. 10 substrate at a processing step subsequent to that shown by FIG. 10.

FIG. 12 is a diagrammatic top plan view of the FIG. 11 substrate, original scale, at a processing step subsequent to that shown by FIG. 11.

FIG. 13 is an enlarged sectional view taken through line 13-13 in FIG. 12.

FIG. 14 is a diagrammatic top plan view of the FIG. 12 substrate at a processing step subsequent to that shown by FIG. 12.

FIG. 15 is an enlarged sectional view taken through line 15-15 in FIG. 14.

FIG. 16 is a view of the FIG. 15 substrate at a processing step subsequent to that shown by FIG. 15.

FIG. 17 is a view of the FIG. 16 substrate at a processing step subsequent to that shown by FIG. 16.

FIG. 18 is a view of the FIG. 17 substrate at a processing step subsequent to that shown by FIG. 17, and is an enlarged view as taken through line 18-18 in FIG. 19.

FIG. 19 is a diagrammatic top plan view of the FIG. 18 substrate, original scale, and corresponds to that of FIG. 1.

DETAILED DESCRIPTION OF EXAMPLE EMBODIMENTS

Figure 2:
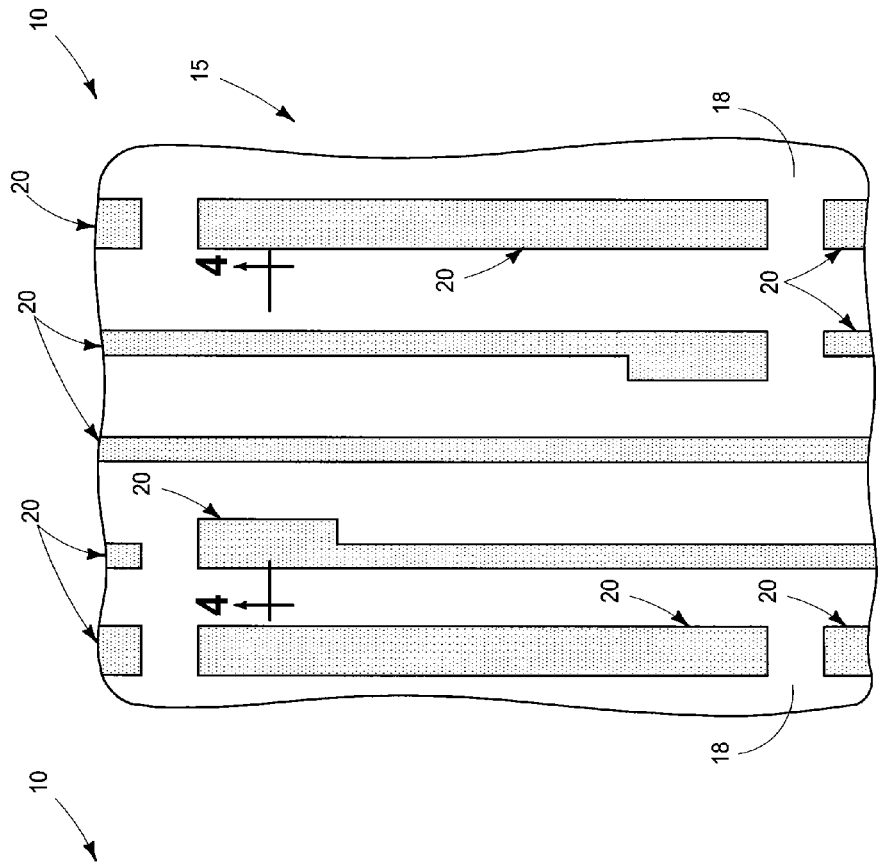
FIG. 2 is a diagrammatic top plan view of one mask pattern that may be used in fabricating the substrate fragment of FIG. 1.
Figure 1:
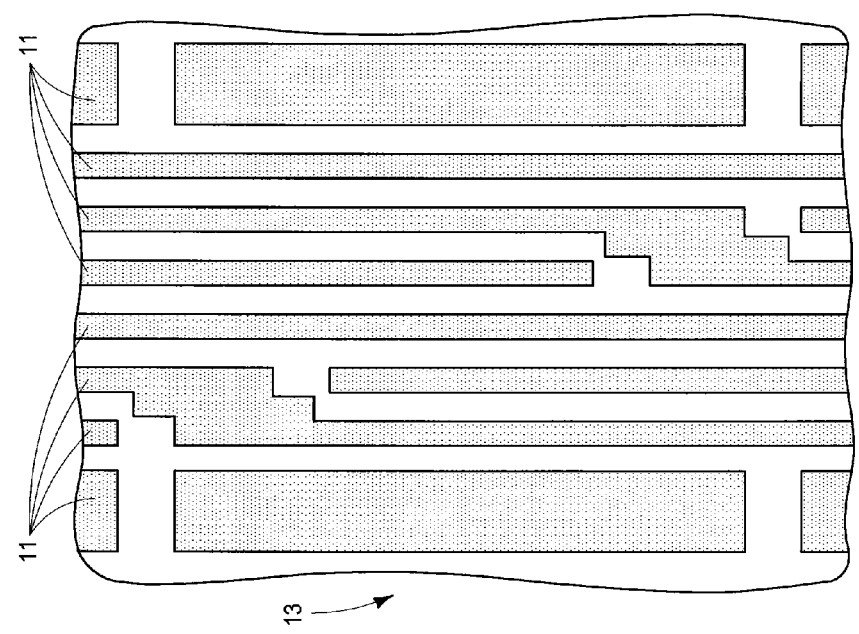
FIG. 1 is a diagrammatic top plan view of a substrate fragment processed in accordance with an embodiment of the invention.

Example embodiments of a method of forming a pattern on a substrate are described initially with reference to FIGS. 1-15. FIG. 1 is a diagrammatic top plan view of a portion of a substrate fragment 10 having an example desired pattern 13 of features 11 (e.g., raised and/or indented) which may or may not be precisely achieved in accordance with embodiments of the invention. Regardless, the FIG. 1 feature pattern 13 may be achieved using first and second lithographic patterning steps. In the context of this document, reference to "first" and "second" with respect to lithographic patterning steps is temporal only with respect to the stated two steps. Accordingly, one or more lithographic or other patterning steps may occur before the stated first lithographic patterning step, after the second lithographic patterning step, and/or between the first and second lithographic patterning steps unless otherwise limited in a claim. The example FIG. 1 feature pattern 13 may be created using only two lithographic patterning steps. An example pattern 15 derived from a first lithographic patterning step is shown in FIG. 2 with respect to a series of stippled features 20. An example pattern derived from a second lithographic patterning step is shown in FIG. 3 with respect to a series of stippled features 36 overlying the pattern of FIG. 2. In FIG. 3, for clarity, features 36 of the second step are stippled whereas features 20 from the first step are not stippled. The combined patterns of features 20 and 36 in FIG. 3 are shown producing pattern 13 of features 11 in FIG. 1. The patterning of FIGS. 2 and 3 steps may be reversed whereby formation of the FIG. 3 pattern occurs before the FIG. 2 pattern, with features 20 overlying features 36 (not shown). Regardless, FIGS. 1 and 3 show a pattern 13 derived from two lithographic patterning steps where first and second patterns have each been 100% precisely aligned relative each other and an underlying substrate. Embodiments of the invention may enable less than 100% precise alignment to greater degree with respect to alignment tolerance as will be apparent below.

Discussion of an example embodiment in accordance with the invention proceeds relative to an example starting substrate fragment 10 as shown in FIGS. 2 and 4. Substrate 10 may comprise a semiconductor substrate. In the context of this document, the term "semiconductor substrate" or "semiconductive substrate" is defined to mean any construction comprising semiconductive material, including, but not limited to, bulk semiconductive material such as a semiconductive wafer (either alone or in assemblies comprising other material thereon), and semiconductive material layers (either alone or in assemblies comprising other material). The term "substrate" refers to any supporting structure, including, but not limited to, the semiconductive substrates described above.

Substrate 10 comprises material 12 which may be a composite of different composition materials. Any of the materials and/or structures described herein may be homogenous or non-homogenous, and regardless may be continuous or discontinuous over any material which such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, each material may be formed using any suitable or yet-to-be-developed technique, with atomic layer deposition, chemical vapor deposition, physical vapor deposition, epitaxial growth, diffusion doping, and ion implanting being examples. Other partially or wholly fabricated components of integrated circuitry may be formed as a part of or be elevationally inward of material 12, and are not particularly germane to the inventions disclosed herein.

Example substrate material 12 comprises material 14, 16, and 18. Material 14 may comprise a region in which a desired pattern is to ultimately be formed by any suitable process, including for example one or more of etching and ion implantation. Accordingly, material 14 may be any one or combination of conductive, dielectric, and semiconductive material. Where material 14 is to be etched, an example material 16 is hard-masking material such as amorphous carbon. An example material 18 is a deposited antireflective coating, such as $Si_xO_yN_z$, where a first lithographic patterning step comprises photolithography. Spaced first features 20 derived from a first lithographic patterning step have been formed as part of substrate fragment 10. As used herein, "derived" from a first or second lithographic patterning step requires lithography (e.g., photolithography) to have been used at some point for the stated step. Once lithography is used, subsequent processing may occur. For example, features that are initially formed using lithography may be subsequently laterally widened or trimmed. Further by way of example only, pitch multiplication techniques may be used whereby sidewall spacers are formed upon lithographically-derived features, followed by removal of those features leaving the sidewall spacers as spaced features (which may then also be laterally widened or trimmed).

In one embodiment, spaced first features 20 are formed to be longitudinally elongated, for example up and down as appearing on the page upon which FIG. 2 lies. Such spaced first features may be parallel one another, have multiple different angled straight and/or curved segments, and/or be curvilinear, by way of examples only. Alternately, the spaced features may not be longitudinally elongated (not shown).

In one example and as shown, the first lithographic patterning step comprises forming a mask 22, for example comprising photoresist 24 over underlying material 12. Mask 22 might be formed by depositing photoresist 24 over material 18, followed by patterning such photoresist to produce features of a desired mask pattern. Further, as an example, those patterned features might be subsequently laterally widened or laterally trimmed. Regardless, in one embodiment, underlying material 12 is etched into using photoresist-comprising mask 22 as an etch mask, for example to produce the construction shown in FIGS. 2 and 4. As an example, from about 25% to 75% of thickness of material 18 may be etched into using a timed-etch. Further, an elevationally outermost portion of material 18 may be formed of some suitable different composition from an elevationally innermost portion thereof to achieve an etch-stopping effect. Regardless, first features 20 in the FIG. 4 example are shown as comprising material 24 (e.g., photoresist) and underlying material 12/18.

Referring to FIGS. 5 and 6, sidewall spacers 26 have been formed on opposing sides of first features 20. Material of sidewall spacers 26 may be of the same or different composition(s) as material 18. Example different composition material includes silicon dioxide or silicon nitride where material 18 comprises $Si_xO_yN_z$. An example technique for forming sidewall spacers 26 includes deposition of a spacer-forming layer followed by anisotropic etch thereof to largely remove such layer from being over horizontal or other non-vertical surfaces. Alternately as an example, sidewall spacers 26 may be grown from outer surfaces of material 24 and/or 18. In this document, "horizontal" refers to a general direction along a primary surface relative to which the substrate is processed during fabrication, and "vertical" is a direction generally orthogonal thereto. Further as used herein, "vertical" and "horizontal" are generally perpendicular directions relative one another independent of orientation of the substrate in three-dimensional space. Further in this document, "elevational" and "elevationally" are generally with reference to the vertical direction.

Referring to FIG. 7, material 24 (not shown) of photoresist-comprising mask 22 (not shown) has been removed. In one embodiment and as shown, sidewall spacers 26 are formed on sidewalls of photoresist 24 of features of photoresist-comprising mask 22 (FIG. 6) after the etching into underlying material 12/18 and prior to removing photoresist 24 (FIG. 7). Regardless, FIG. 7 depicts but one example embodiment wherein sidewall spacers 26 are formed to be laterally separate from one another and to project elevationally outward of first features 20 in the at least one depicted cross-section. In one embodiment, material of first features 20 is laterally trimmed after the first lithographic patterning step and before forming sidewall spacers 26. For example, material 24 may be laterally trimmed prior to etching into material 12/18. Alternately by way of example, material 18 and 24 might be laterally trimmed after etching into underlying material 18. As an additional example, material 24 might be removed and material 18 subsequently laterally trimmed prior to forming the sidewall spacers.

Referring to FIG. 8, material 30 and material 32 have been deposited. An example material 30 is a spin-on organic material which in one embodiment may be of the same or etchably-similar composition(s) to that of material 16. Material 32 may be of the same, similar, or different composition(s) as that of material 18. One or both of material 30 and material 32 may not be used, for example as described in an alternate embodiment below.

Referring to FIGS. 9 and 10, spaced second features 36 derived from a second lithographic patterning step have been formed. At least some of individual second features 36 are laterally between and laterally spaced from immediately adjacent first features 20 in at least one straight-line vertical cross-section that passes through the first and second features, for example the cross-section depicted in FIG. 10. In one embodiment, second features 36 are longitudinally elongated. In one embodiment, only some of individual of the second features are laterally between and laterally spaced from immediately adjacent of the first features in the at least one cross-section. For example and by way of example only, FIG. 10 shows the two far-right second features 36 as being laterally between and laterally spaced from immediately adjacent first features 20 in the depicted cross-section, whereas the far-left second feature 36 is not so-positioned. In one embodiment, some individual of second features 36 are laterally between and laterally spaced from immediately adjacent first features in the at least one cross-section (e.g., the two far-right features 36), and another some of individual second features 36 partially laterally overlap with individual first features 20 in the cross-section (e.g., like the far-left feature 36). Further, in one embodiment, those second features which partially laterally overlap with an individual first feature 20 cover the sidewall spacer that is against the side of the individual first feature that it partially overlaps (e.g., like the far-left feature 36). In one embodiment, second features 36 comprise photoresist 37, and in one embodiment that is over underlying material (e.g., material 32/30) that covers first features 20 in the depicted cross-section. In one embodiment, underlying material 32/30 has a planar elevationally outermost surface 38. In one embodiment, at least one of the first and second lithographic patterning steps uses photoresist, and in one embodiment both use photoresist.

Referring to FIG. 11, material 32/30 has been etched elevationally inward selectively relative to material 18 (i.e., at a removal rate of at least 2:1 greater) using photoresist 37 (not shown) as a mask, with such photoresist then being removed. Second features 36 thereby comprise material 32/30 in FIG. 11.

In one embodiment, forming of the second features may comprise laterally trimming material of the second features after the second lithographic patterning step, for example as shown in FIGS. 12 and 13. As an alternate and/or additional example where so-trimmed, material 37 in FIG. 10 may be laterally trimmed prior to etching material 32/30. Alternately, no lateral trimming might occur, for example with the second features having one of the profiles depicted in either FIG. 11 or FIGS. 12, 13 without trimming.

Referring to FIGS. 14 and 15, and in one embodiment, all of only some of sidewall spacers 26 have been removed in the depicted at least one cross-section, thereby forming a feature pattern 35. An example removal technique includes etching, for example dry and/or wet etching the spacer material selectively relative to other material exposed during such etching. Regardless, in one embodiment, all of only a longitudinal portion of at least some of the sidewall spacers is removed. In one embodiment, the removing is of all of only a longitudinal portion of only some of the sidewall spacers. In one embodiment, at least some of the sidewall spacers are removed in the depicted cross-section. Further, in one embodiment, the sidewall spacers are removed in the one cross-section except (i.e., but for) the covered sidewall spacers in the at least one cross-section, for example the depicted covered sidewall spacers 26a in FIGS. 14 and 15. Accordingly in some embodiments, the removing is of only some of the sidewall spacers in the at least one straight-line vertical cross-section. In one embodiment, at least some of the second features individually comprise an elevationally outer sidewall portion that projects laterally outward relative to an elevationally inner sidewall portion in the at least one cross-section. For example, FIGS. 14 and 15 depict such an example elevationally outer sidewall portion 43 that projects laterally outward relative to an elevationally inner sidewall portion 45 of the two far-right illustrated second features 36.

In one embodiment, the laterally projecting outer sidewall portion of the at least some second features 36 is removed, and in one embodiment is so-removed after removing of some of the sidewall spacers in the at least one cross-section. FIG. 16 depicts subsequent processing whereby such has occurred, forming a feature pattern 39. For example, material 32 (not shown) has been removed by a timed etch inwardly to material 16 whereby first features 20 remain over material 16. Such act of etching may have the depicted effect of removing laterally projecting outer sidewall portion 43 (not shown), for example by rounding an outer portion of material 30. For example where material 30 comprises carbon and material 32 comprises $Si_xO_yN_z$, example etching chemistries that etch $Si_xO_yN_z$ and will remove a carbon-containing projecting portion 43 include one or both of CF4 and HBr. Regardless, FIGS. 15 and 16 depict example embodiments wherein second features 36 are formed to be taller than first features 20 after the removing of spacers 26 (not shown).

Intent in the above embodiments of FIGS. 4-16 may be to produce feature pattern 39 to be or have the depicted 100% perfect mask alignment in producing feature pattern 13 shown by FIGS. 1-3. Such has not occurred in the embodiments of FIGS. 4-16. Rather, the second lithographic patterning step in the processing depicted in the FIGS. 4-16 embodiment has been laterally misaligned to the left in comparison to the first lithographic patterning step. Specifically, by way of example, second features 36 have been formed as shown in FIGS. 10-13 such that at least one lateral edge of at least some of individual second features 36 are elevationally over individual sidewall spacers 26 in the depicted at least one straight-line and vertical cross-section. Such spacers may thereby, in one embodiment, provide for a greater degree of lateral misalignment to better assure that features derived from a second lithographic patterning step do not overlie, or are positioned too closely to, features derived from a first lithographic patterning step.

Regardless, processing in accordance with some embodiments of the invention may be complete at the conclusion of at least some spacer removal, for example at the conclusion of the processing depicted by FIGS. 14 and 15, or FIG. 16. Alternately or additionally, subsequent processing may occur as described below and/or otherwise. For example, substrate material may be subsequently processed through a mask pattern that comprises the first and second features after at least some spacer removal. Such processing may include one or both of ion implanting and etching, by way of examples only.

FIGS. 17-19 show subsequent processing in the form of ultimate etching of substrate material 14. In FIG. 17, mask pattern 39 has been used as an etch mask while etching into underlying material 16/14. Where material 16 and material 30 (not shown) are of the same or similar composition, material 30 (not shown) may be removed while etching material 16, as is shown. In FIGS. 18 and 19, material 18 (not shown) and all remaining sidewall spacers 26 (not shown) have been removed before, during, and/or after using material 16 as a hard-mask while etching into substrate material 14. Subsequent processing may occur, for example removal (not shown) of material 16.

Figure 20:
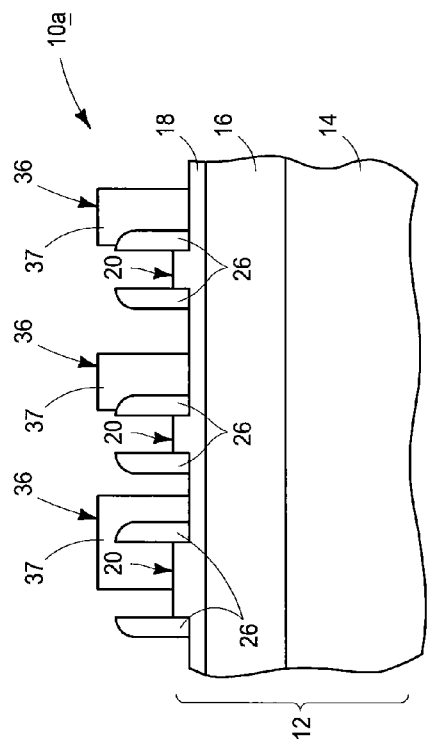
FIG. 20 is a view of a substrate fragment processed in accordance with an alternate embodiment, and corresponds in processing sequence to that of FIG. 10.

The above-described embodiment with respect to FIGS. 9 and 10 with material 37 comprising photoresist is an example where the second lithographic patterning step uses photoresist that is over underlying material that covers first features 20 in the at least one cross-section. As an alternate example, the second lithographic patterning step may use photoresist that is directly against first features 20 in the absence of underlying material 32/30. Such is shown in an alternate embodiment with respect to a substrate fragment 10a in FIG. 20. Like numerals from the above-described embodiments have been used. For example, FIG. 20 shows second features 36 comprising photoresist 37 as being directly against some first features 20 and directly against at least some sidewall spacers 26.

Figure 21:
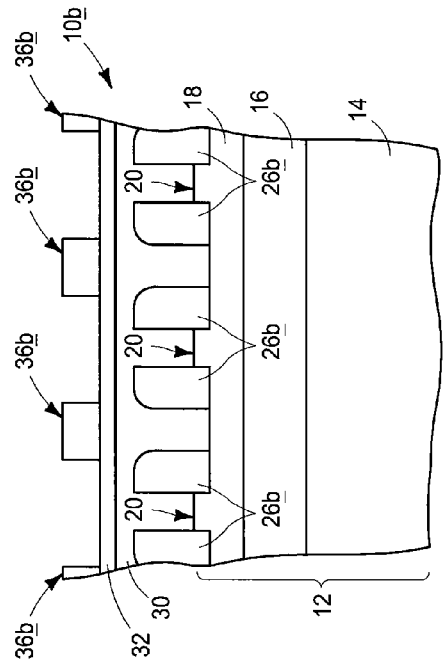
FIG. 21 is a view of a substrate fragment processed in accordance with another alternate embodiment, and corresponds in processing sequence to that of FIG. 10.
Figure 22:
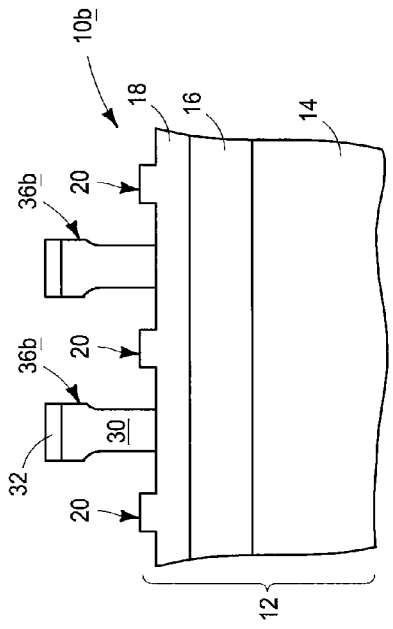
FIG. 22 is a view of the FIG. 21 substrate at a processing step subsequent to that shown by FIG. 21.

The above described processing with respect to FIGS. 4-13 show an example embodiment wherein at least one lateral edge of at least some of individual second features 36 is elevationally over individual sidewall spacers 26 in the depicted cross-section. Further, the sidewall spacers may be sized, and/or features of the second lithographic patterning step may be sized, such that both lateral edges of at least some individual second features lie elevationally over individual sidewall spacers in the depicted cross-section. Such an example embodiment is shown and described with respect to FIGS. 21 and 22 and an alternate substrate fragment 10b. Like numerals from the above described embodiments have been used where appropriate, with some construction differences being indicated with the suffix "b". FIG. 21 corresponds in processing sequence to that of FIG. 10 in the first-described embodiments. Sidewall spacers 26b are shown to be laterally wider/thicker than spacers 26 of the first-described embodiments. At least some of individual second features 36b have both their lateral edges over individual sidewall spacers 26b in the depicted cross-section. FIG. 22 shows subsequent removal of such sidewall spacers 26b (not shown). Any of the processing described above with respect to FIGS. 1-20 may be used in the embodiment of FIGS. 21 and 22.

CONCLUSION

In some embodiments, a method of forming a pattern on a substrate comprises forming spaced first features derived from a first lithographic patterning step. Sidewall spacers are formed on opposing sides of the first features. After forming the sidewall spacers, spaced second features derived from a second lithographic patterning step are formed. At least some of individual of the second features are laterally between and laterally spaced from immediately adjacent of the first features in at least one straight-line vertical cross-section that passes through the first and second features. After the second lithographic patterning step, all of only some of the sidewall spacers in said at least one cross-section is removed.

In some embodiments, a method of forming a pattern on a substrate comprises forming spaced first features derived from a first lithographic patterning step. Sidewall spacers are formed on opposing sides of the first features. After forming the sidewall spacers, spaced second features derived from a second lithographic patterning step are formed. Some of individual of the second features are laterally between and laterally spaced from immediately adjacent of the first features in at least one straight-line vertical cross-section that passes through the first and second features. Another some of individual of the second features partially laterally overlap with individual of the first features in said at least one cross-section and cover the sidewall spacer that is against the side of the individual first feature it partially laterally overlaps. After the second lithographic patterning step, the sidewall spacers in said at least one cross-section are removed but for the covered sidewall spacers in said at least one cross-section.

In some embodiments, a method of patterning a substrate comprises forming spaced longitudinally elongated first features derived from a first lithographic patterning step. Sidewall spacers are formed on opposing sides of the first features. After forming the sidewall spacers, spaced longitudinally elongated second features derived from a second lithographic patterning step are formed. At least some of individual of the second features are laterally between and laterally spaced from immediately adjacent of the first features in at least one straight-line vertical cross-section that passes through the first and second features. After the second lithographic patterning step, all of only a longitudinal portion of at least some of the sidewall spacers is removed. After the removing, substrate material is processed through a mask pattern comprising the first and second features.

In some embodiments, a method of patterning a substrate comprises forming spaced first features derived from a first lithographic patterning step. Sidewall spacers are formed on opposing sides of the first features. After forming the sidewall spacers, spaced second features derived from a second lithographic patterning step are formed. At least some of individual of the second features are laterally between and laterally spaced from immediately adjacent of the first features in at least one straight-line vertical cross-section that passes through the first and second features. After the second lithographic patterning step, at least some of the sidewall spacers in said at least one cross-section are removed. After the removing, substrate material is processed through a mask pattern comprising the first and second features.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a pattern on a substrate, comprising:
    forming spaced first features derived from a first lithographic patterning step;
    forming sidewall spacers on opposing sides of the first features;
    after forming the sidewall spacers, forming spaced second features derived from a second lithographic patterning step; at least some of individual of the second features being laterally between and laterally spaced from immediately adjacent of the first features in at least one straight-line vertical cross-section that passes through the first and second features; and
    after the second lithographic patterning step, removing all of only some of the sidewall spacers in said at least one cross-section, and forming the second features to be taller than the first features after the removing.

2. The method of claim 1 wherein,
    the first lithographic patterning step sequentially comprises:
        forming a photoresist-comprising mask over underlying material;
        etching into the underlying material using the photoresist-comprising mask as an etch mask; and
        removing the photoresist of the photoresist-comprising mask; and
    the first features comprise the underlying material.

3. The method of claim 1 wherein forming the second features comprises forming at least one lateral edge of at least some of the individual second features elevationally over individual of the sidewall spacers in said at least one cross-section.

4. The method of claim 1 wherein at least some of the second features individually comprise an elevationally outer sidewall portion that projects laterally outward relative to an elevationally inner sidewall portion in said at least one cross-section.

5. The method of claim 1 wherein the second lithographic patterning step uses photoresist that is directly against some of the first features in said at least one cross-section.

6. The method of claim 1 wherein the second lithographic patterning step uses photoresist that is directly against at least some of the sidewall spacers in said at least one cross-section.

7. The method of claim 1 wherein forming the first features comprises laterally trimming material of the first features after the first lithographic patterning step and before forming the sidewall spacers.

8. The method of claim 1 wherein forming the second features comprises laterally trimming material of the second features after the second lithographic patterning step and before the removing.

9. The method of claim 1 wherein at least one of the first and second lithographic patterning steps uses photoresist.

10. The method of claim 9 wherein both of the first and second lithographic patterning steps use photoresist.

11. The method of claim 1 wherein the second lithographic patterning step uses photoresist that is over underlying material that covers the first features in said at least one cross-section.

12. The method of claim 11 wherein the underlying material has a planar elevationally outermost surface.

13. The method of claim 1 comprising processing substrate material through a mask pattern comprising the first and second features after the removing.

14. The method of claim 13 comprising removing all remaining of the sidewall spacers in said at least one cross-section during and/or after the processing.

15. A method of forming a pattern on a substrate, comprising:
    forming spaced first features derived from a first lithographic patterning step;
    forming a pair of sidewall spacers on opposing sides of individual of the first features;
    after forming the sidewall spacers, forming spaced second features derived from a second lithographic patterning step; at least some of individual of the second features being laterally between and laterally spaced from immediately adjacent of the first features in at least one straight-line vertical cross-section that passes through the first and second features;
    after the second lithographic patterning step, removing all of only some of the sidewall spacers in said at least one cross-section; and
    wherein the sidewall spacers are formed to be laterally separate from one another and to project elevationally outward of the first feature that is between the sidewall spacers in individual of the pairs in said at least one cross-section.

16. A method of forming a pattern on a substrate, comprising:
    forming spaced first features derived from a first lithographic patterning step;
    forming sidewall spacers on opposing sides of the first features;
    after forming the sidewall spacers, forming spaced second features derived from a second lithographic patterning step; at least some of individual of the second features being laterally between and laterally spaced from immediately adjacent of the first features in at least one straight-line vertical cross-section that passes through the first and second features;
    after the second lithographic patterning step, removing all of only some of the sidewall spacers in said at least one cross-section;
    wherein the first lithographic patterning step sequentially comprises:
        forming a photoresist-comprising mask over underlying material;
        etching into the underlying material using the photoresist-comprising mask as an etch mask;
        removing the photoresist of the photoresist-comprising mask; and
        the first features comprise the underlying material; and
    wherein forming the sidewall spacers comprises forming the sidewall spacers on sidewalls of photoresist of features of the photoresist-comprising mask after the etching and prior to removing of the photoresist.

17. A method of forming a pattern on a substrate, comprising:
    forming spaced first features derived from a first lithographic patterning step;

forming sidewall spacers on opposing sides of the first features;

after forming the sidewall spacers, forming spaced second features derived from a second lithographic patterning step; at least some of individual of the second features being laterally between and laterally spaced from immediately adjacent of the first features in at least one straight-line vertical cross-section that passes through the first and second features;

after the second lithographic patterning step, removing all of only some of the sidewall spacers in said at least one cross-section; and wherein forming the second features comprises forming both lateral edges of at least some individual of the second features elevationally over individual of the sidewall spacers in said at least one cross-section.

18. A method of forming a pattern on a substrate, comprising:

forming spaced first features derived from a first lithographic patterning step;

forming sidewall spacers on opposing sides of the first features;

after forming the sidewall spacers, forming spaced second features derived from a second lithographic patterning step; at least some of individual of the second features being laterally between and laterally spaced from immediately adjacent of the first features in at least one straight-line vertical cross-section that passes through the first and second features;

after the second lithographic patterning step, removing all of only some of the sidewall spacers in said at least one cross-section;

wherein at least some of the second features individually comprise an elevationally outer sidewall portion that projects laterally outward relative to an elevationally inner sidewall portion in said at least one cross-section; and comprising removing the laterally projecting outer sidewall portion.

19. The method of claim 18 comprising removing the laterally projecting outer sidewall portion after the removing of all of only some of the sidewall spacers in said at least one cross-section.

20. A method of forming a pattern on a substrate, comprising:

forming spaced first features derived from a first lithographic patterning step;

forming sidewall spacers on opposing sides of the first features;

after forming the sidewall spacers, forming spaced second features derived from a second lithographic patterning step; some of individual of the second features being laterally between and laterally spaced from immediately adjacent of the first features in at least one straight-line vertical cross-section that passes through the first and second features, another some of individual of the second features partially laterally overlapping with individual of the first features in said at least one cross-section and covering all of the sidewall spacer that is against the side of the individual first feature it partially laterally overlaps; and after the second lithographic patterning step, removing the sidewall spacers in said at least one cross-section but for the covered sidewall spacers in said at least one cross-section.

21. The method of claim 20 comprising processing substrate material through a mask pattern comprising the first and second features after the removing, and subsequently removing the covered sidewall spacers in said at least one cross-section.

\* \* \* \* \*